(12) United States Patent
De Jong et al.

(10) Patent No.: US 7,170,847 B2
(45) Date of Patent: Jan. 30, 2007

(54) MEANS FOR LIMITING AN OUTPUT SIGNAL OF AN AMPLIFIER STAGE

(75) Inventors: Gerben Willem De Jong, Eindhoven (NL); Johannes Hubertus Antonius Brekelmans, Eindhoven (NL); Jozef Reinerus Maria Bergervoet, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 11 days.

(21) Appl. No.: 10/531,012

(22) PCT Filed: Sep. 19, 2003

(86) PCT No.: PCT/IB03/04237
§ 371 (c)(1),
(2), (4) Date: Apr. 12, 2005

(87) PCT Pub. No.: WO2004/036743
PCT Pub. Date: Apr. 20, 2004

(65) Prior Publication Data
US 2005/0286394 A1    Dec. 29, 2005

(30) Foreign Application Priority Data
Oct. 17, 2002  (EP) .................................. 02079307

(51) Int. Cl.
*G11B 7/00* (2006.01)

(52) U.S. Cl. .............................. 369/124.11; 369/44.25; 369/44.36

(58) Field of Classification Search ...................... None
See application file for complete search history.

(56) References Cited

U.S. PATENT DOCUMENTS 4,660,122 A * 4/1987 Evans .......................... 361/90

(Continued)

*Primary Examiner*—William Korzuch
*Assistant Examiner*—Christopher Lamb

(57) ABSTRACT

An electronic circuit is provided which can autonomously handle an input current ($I_i$) having a relatively wide dynamic range without being overdriven. The electronic circuit comprises an amplifier stage (AMPST) having an input (IP) for receiving the input current ($I_i$) and an output (OP) for supplying an output current ($I_o$), such that, during operation, the strength of the output current ($I_o$) increases in response to an increasing strength of the input current ($I_i$) as long as the strength of the input current ($I_i$) has not exceeded an input reference level. The strength of the output current ($I_o$) is kept approximately constant when the strength of the input current ($I_i$) has exceeded the input reference level but has not exceeded a further input reference level. The strength of the output current ($I_o$) decreases in response to an increasing strength of the input current ($I_i$) when the strength of the input current ($I_i$) has exceeded the further input reference level. The amplifier stage (AMPST) may comprise a current mirror (CM) having an input which forms the input (IP), an output which forms the output (OP), and a common node (cn). The amplifier stage (AMPST) further comprises first control means (FCM) having an input connected to the input (EP), and an output connected to the common node (cn). First control means (FCM) controls a current ($I_2$) to the common node (cn) and a voltage ($V_{cn}$) at the common node (cn). The first control means (FCM) comprises limiting means (LMT) for limiting the current ($I_2$) when the value of the input current ($I_i$) has exceeded the input reference level. Then both the input and the output currents ($I_i$ and $I_o$) are limited. In order to avoid a saturation situation of a current source ($I_s$) which supplies a current (I) to the input (EP), the amplifier stage (AMPST) may comprise second control means (SCM) for supplying a compensation current ($I_{CMP}$) to the input (IP) when the input signal ($I_i$) has exceeded the input reference level. The current mirror (CM) comprises first ($CP_1$) and second ($CP_2$) current paths which form the core of the current mirror (CM), as is generally known. The decrease in response to an increasing strength of the input current ($I_i$) when the strength of the input current ($I_i$) has exceeded the further input reference level is implemented by a third current path ($CP_3$) which takes away current from the second current path ($CP_2$). Optionally, to avoid that the value of the output current ($I_o$) can become too low, a fourth current path ($CP_4$) may be implemented which applies current to the second current path ($CP_2$). The inventive electronic circuit may be advantageously applied in all electronic systems (like CD-apparatus) which need means to limit a maximum output signal.

8 Claims, 14 Drawing Sheets

U.S. PATENT DOCUMENTS 5,706,352 A * 1/1998 Engebretson et al. ....... 381/312

6,108,293 A 8/2000 Nakano et al.

* cited by examiner

AMPST

MEANS FOR LIMITING AN OUTPUT SIGNAL OF AN AMPLIFIER STAGE

The invention relates to an electronic circuit comprising an amplifier stage having an input for receiving an input signal and an output for supplying an output signal, wherein, during operation, the strength of the output signal increases in response to an increasing strength of the input signal as long as the strength of the input signal has not exceeded an input reference level.

Such an electronic circuit is known from the general state of the art. In numerous electronic systems amplifiers are needed to amplify a signal. Generally a relatively weak input signal is converted into a relatively strong output signal. In many occasions the amplifier comprises several amplifier stages. Sometimes the dynamic range of the input signal is very large. This can cause an overdrive of one or more of the amplifiers stages. This is not always a serious problem. In fact in many applications it is appreciated that relatively strong input signals cannot be amplified into output signals above a certain desired level. When an amplifier stage is overdriven, this causes one or more bipolar transistors (if implemented in the amplifier stage) to go into saturation, or causes one or more field effect transistors (if implemented in the amplifier stage) to go out of saturation. If the input signal decreases after such an overdrive has occurred, the amplifier should quickly recover in order to fully amplify the weaker input signal within a short amount of time. However, bipolar transistors need some time to come out of saturation, and field effect transistors need some time to get into saturation again. For this reason the amplifier needs some time to recover. There are applications which require a very short recovery time of the amplifier. A very good way to guarantee a very short recovery time is to provide the amplifier with clipping means implemented in such away that the transistors which might influence the recovery time cannot go out of their normal biasing, that is to say: bipolar transistors will never go into saturation, and field effect transistors will never go out of saturation.

U.S. Pat. No. 6,108,293 discloses an optical disk recording device for reading and recording of data through irradiation by a laser beam on an optical disk medium. The device comprises a photo detection circuit for receiving input of reflected light from an optical disk medium to detect a reproduced signal. An amplifier amplifies the reproduced signal and outputs the amplified reproduced signal for monitoring. In a recording mode, high-intensity laser pulses are focused on the optical disk medium. In between these pulses, information (like in reading mode) must also be read in order to acquire tracking information and e.g. a so-called wobble signal. The high-density laser pulses cause a relatively high amplitude of the signal from the photo detection circuit which is put into the amplifier. This may overdrive the amplifier. As a consequence the recovery time of the amplifier may be too long. A way to overcome this problem is proposed by the addition of current subtracting means which subtracts current away from the photo detection circuit under control of a so-called recording gate signal. An alternative solution is proposed whereby a gain control circuit is added in between the photo detection circuit and the amplifier. The gain of the gain control circuit is then also put under the control of a recording gate signal.

A disadvantage of both proposed solutions is that they need additional information (e.g. the recording gate signal) and additional circuitry in order to avoid an overdrive of the amplifier. In other words, the amplifier cannot autonomously perform its amplifying task without the danger of being overdriven.

Therefore it is an object of the invention to provide an electronic circuit which can autonomously handle an input signal having a relatively wide dynamic range without being overdriven.

To this end, according to the invention, the electronic circuit of the type defined in the opening paragraph is characterized in that the strength of the output signal is kept approximately constant when the strength of the input signal has exceeded the input reference level but has not exceeded a further input reference level, and that the strength of the output signal decreases in response to an increasing strength of the input signal when the strength of the input signal has exceeded the further input reference level.

An overdrive of the amplifier stage can be avoided by proper definition of the input reference level. By proper definition of the input reference level is meant that input signals having an amplitude not higher than the input reference level will be amplified by the amplifier stage in a normal mode (usually this means a more or less linear amplification), that is to say without clipping. The amplifier stage is dimensioned in a way such that the transistors which might influence the recovery time of the amplifier stage remain normally biased, that is to say they will not undesirably go into or out of saturation in this normal mode. When the amplitude of the input signal is higher than the input reference level, but still not higher than the further input reference level, the amplifier stage is in a clipping mode. The output signal is kept constant in the clipping mode. The clipping is performed in a manner such that the transistors of the amplifier stage retain their normal biasing.

In principle the inventive electronic circuit may have only one amplifier stage. Usually, however, a plurality of amplifier stages is used. If, for example, two amplifier stages are used, it may be sufficient that only the first amplifier stage is provided with the said clipping means. After all, in this situation, the amplitude of the output signal of the first amplifier stage, which forms the input signal of the second amplifier stage, is already clipped when the amplitude of the input signal has exceeded the input reference level. However, it is to be emphasized that it is not necessary that the inventive amplifier stage should always be the first stage. Several inventive amplifier stages may alternatively be applied.

When the amplitude of the input signal is higher than the further input reference level, the amplifier stage is in a fold-back mode, that is to say that the amplitude of the output signal is no longer kept constant, but decreases with a further increase in the amplitude of the input signal. This has the advantage of a reduced power consumption of the electronic circuit.

An embodiment of the invention is characterized in that the strength of the output signal cannot become lower than an output reference level when the strength of the input signal has exceeded the further input reference level. It is avoided thereby that current through transistors in the amplifier stage can become very low, e.g. zero. This prevents transistors from reacting slowly. If the output signal has reached the said output reference level, this situation will be further denoted the minimum fold-back mode. Thus the recovery time of the amplifier from the (minimum) fold-back mode into the normal mode is further decreased. Any other amplifier stages following the inventive amplifier stage will also recover more quickly.

An embodiment of the invention is characterized in that the further input reference level is approximately equal to the input reference level. This means that the clipping mode is now not present. Thus when the amplitude of the input signal exceeds the input reference level, the amplifier immediately enters the fold-back mode. This has the advantage that the average power consumption of the amplifier stage is further reduced. Another advantage is the somewhat less complex implementation of the amplifier stage.

The presence of a clipping mode, however, may be advantageous. If, for example, the dynamic range of the input signal is such that it just does not exceed the input reference level, then the presence of some noise, which is unfortunately always present in a signal, may cause the input reference signal to be exceeded during the positive values of the noise and not during the negative values of the noise. This causes a distortion of the output signal because HF-noise can be converted into LF-noise in this case. Also a DC-component is introduced by this clipping. If there is no clipping mode in such a situation, however, the amplifier will enter into the fold-back mode during the positive values of the noise. This causes the same distortion as previously described, but at a much higher level. Thus it depends on the design parameters of the electronic circuit whether or not it is desirable to implement a clipping mode in the amplifier stage.

An embodiment of the invention is characterized in that the input signal is an input current, and the output signal is an output current. In practice the invention can most easily be implemented in the current domain. Then the core of the amplifier stage can be implemented by a (simple) current mirror which may have a current mirror gain factor.

Alternatively, the invention may be implemented in the voltage domain. This is even possible when the input signal is a current, and an output signal of the electronic circuit is also a current. It is then possible to put the input signal into a current-to-voltage converter, apply the inventive principles in the voltage domain, and then convert the voltage back into a current by a voltage-to-current converter.

An embodiment of the invention in which the input and output signals of the amplifier stage are currents is characterized in that the amplifier stage comprises a first current path coupled between the input and a common node; a second current path coupled between the output and the common node; first control means coupled between the input and the common node for controlling a voltage on the common node and for supplying a current to the common node, the first control means comprising limiting means for limiting the current to the common node when the strength of the input signal has exceeded the input reference level; and second control means for supplying a compensation current to the input when the strength of the input signal has exceeded the input reference level. The first and second current paths together form a current mirror. Usually a current mirror has an input, an output, and a common reference which is usually connected to a power supply terminal. In this case the input of the current mirror thus formed is in fact the input of the amplifier stage, and thus receives current from a signal current source. The output of the current mirror is in fact the output of the amplifier stage. The common reference, which is denoted the common node, is not connected to a power supply terminal in this invention but to the first control means. This provides the possibility of not only controlling the voltage at the common node, but also of limiting the maximum current to the common node. If the input current level becomes higher than the input reference level, then the current to the common node is limited by the limiting means within the first control means. In that situation the current from the signal current source can no longer be fully put into the input of the amplifier stage. This would cause a saturation situation of the signal current source, whereby the signal current source is forced to deliver less current. Generally this is an unfavorable situation. This situation is avoided, however, by the presence of the second control means, which supplies a compensation current to the input when the strength of the input signal has exceeded the input reference level.

An embodiment of the invention is characterized in that the amplifier stage further comprises a third current path having a first side coupled to the input and a second side coupled to the second current path for taking away current from the second current path, such that the strength of the output current decreases in response to an increasing strength of the input signal when the strength of the input signal has exceeded the further input reference level. This is an example of an implementation of the fold-back mode. The taking away of part of the current is not accomplished by a separate current means but by using (part of) the residual portion of the current delivered by the signal current source. This reduces the power consumption of the amplifier stage.

An embodiment of the invention is characterized in that the amplifier stage further comprises a fourth current path coupled to the second current path for supplying current to the second current path in order to avoid that the output current can be lower than the output reference level when the strength of the input signal has exceeded the further input reference level. This is an example of an implementation of the minimum fold-back mode. The coupling of the fourth current path to the second current path may coincide with the second side of the third current path. This is, however, not a necessity.

The invention also relates to an optical/magneto-optical disk recording apparatus. An inventive optical/magneto-optical disk recording apparatus having a light source for storing data on a disk, and light-receiving means for the detection of data from the disk, is characterized in that it comprises the inventive electronic circuit wherein the input signal of the amplifier stage is responsive to a signal delivered by the light receiving means.

The light source is usually a laser. Light pulses with a high intensity are used to write data on an optical disk. Such a disk is, for example, a CD (Compact Disk), DVD (Digital Versatile Disk), or BD (Blu-ray Disk, formerly denoted DVR). The apparatus comprises a so-called PDIC (Photo Diode Integrated Circuit) which is an IC having (pre-) amplifiers and integrated photo diodes, the latter acting as the light-receiving means for the detection of data from the disk. The PDIC is used to monitor the reading/writing process. In order not to overdrive the PDIC during the writing process, a low amplifier gain is needed. However, the signal parts in between the high intensity light pulses must also be read because they contain servo information, track addresses, and a wobble signal. These signal parts cannot be processed with a low amplifier gain, however, because these signals parts would then drown in offset and noise. This is because these signal parts have in fact a small amplitude (comparable to the amplitude of the signal during the reading process). A high amplifier gain is therefore needed.

A high amplifier gain is thus needed during the writing process for the processing of the weak signal parts in between the high intensity light pulses on the one hand, and on the other hand a low amplifier gain is needed to monitor the (reflected) high intensity light pulses without overdriving the PDIC. It is possible in theory to switch between a low and a high gain path. In practice this turns out to be difficult to implement because it imposes very high settling requirements on amplifiers stages.

The implementation of the inventive electronic circuit overcomes this difficulty because it comprises the inventive amplifier stage which can handle a very wide dynamic range of the input signal without being overdriven.

The inventive electronic circuit can be advantageously applied in all electronic systems which need means for limiting an output signal and which need a very short recovery time when the relatively strong input signal is reduced to a relatively weak input signal. The electronic circuit may thus be used, for example, in the high-frequency part of a receiver (like radio, television), where clipping of strong signals does not cause distortion of the information, for example when frequency or phase modulation is used. If the receiver is of the very commonly used "super heterodyne type", then the inventive amplifier stage may also be implemented in the so-called intermediate-frequency part.

The invention also includes a method whereby an input signal is converted into an output signal, and whereby the strength of the output signal increases in response to an increasing strength of the input signal as long as the strength of the input signal does not exceed an input reference level, and whereby the strength of the output signal is kept approximately constant when the strength of the input signal exceeds the input reference level but does not exceed a further input reference level, and whereby the strength of the output signal decreases in response to an increasing strength of the input signal when the strength of the input signal exceeds the further input reference level.

Optionally, the further input reference level may be chosen to be equal to the input reference level. This has the effect that the output signal immediately decreases in response to an increasing strength of the input signal when the strength of the input signal has exceeded the input reference level.

An embodiment of the inventive method is characterized in that the strength of the output signal does not become lower than an output reference level when the strength of the input signal exceeds the further input reference level.

The invention will be described in more detail with reference to the accompanying drawings, in which:

In these Figures, parts or elements having like functions or purposes bear the same reference symbols.

FIG. 1 is a simplified diagram of an optical disk drive recording/reading apparatus comprising a light source LS, a half-prism HP, an objective lens OL, photo diodes PHDS, and electronic processing means PR.

In a reading mode, information stored on an optical (or magneto-optical) disk DSK must be retrieved. The light source LS, which is usually a laser device, radiates a light beam which passes partly through the half-prism HP. The light is then focused on an information layer of the DSK by the objective lens OL. The information layer may comprise so-called pits and lands. These pits and lands are in fact logic "0" and "1" values representing the information. Thus the information is stored in a binary (and digital) form. Light incident on a land is strongly reflected back. Light incident on a pit is also reflected back, but to a lesser degree. Therefore the stored logic "0" and "1" values can be retrieved by detection of the reflected light from the disk DSK. The reflected light is partly mirrored and is received by light-receiving means. The light-receiving means are, for example, implemented by the photo diodes PHDS. Usually the photo diodes PHDS comprise several parts for delivering separate signals to the processing means PR. In this example the photo diodes PHDS comprise 4 parts, and thus 4 separate signals A, B, C, and D are delivered. In many cases the photo diodes PHDS and the processing means PR are constructed in a single IC (integrated circuit) which is often denoted as PDIC (Photo Diode Integrated Circuit). The processing means PR retrieves the information (usually) through summation of the 4 signals A, B, C, and D. Other information is also acquired by various combinations of the 4 signals A, B, C, and D. Thus servo information, track addresses, wobble signals, etcetera can be retrieved in this manner as well.

There are several ways to register information on the disk in the recording (writing) mode. Instead of using the method of actually creating pits and lands, which method is normally used in the manufacture of ROM-disks, other methods are normally used for recordable disks. The disk DSK is provided, for example, with a dye which partly reflects light. During recording the reflectivity of the dye is reduced as a result of the focusing of high-intensity laser pulses $L_1$ (see FIG. 3) on the optical disk DSK Logic "0" and "1" values can be stored and may (later) be retrieved through detection of the reflected light from the disk DSK. Instead of using a dye as the information layer of the disk DSK, alternative principles for registering information may also be applied, for example the so called "phase change principle". In this latter principle a crystalline material is converted into an amorphous material (or vice versa) as the result of the focusing of the high-intensity laser pulses $L_1$ on the optical disk DSK.

Figure 1:
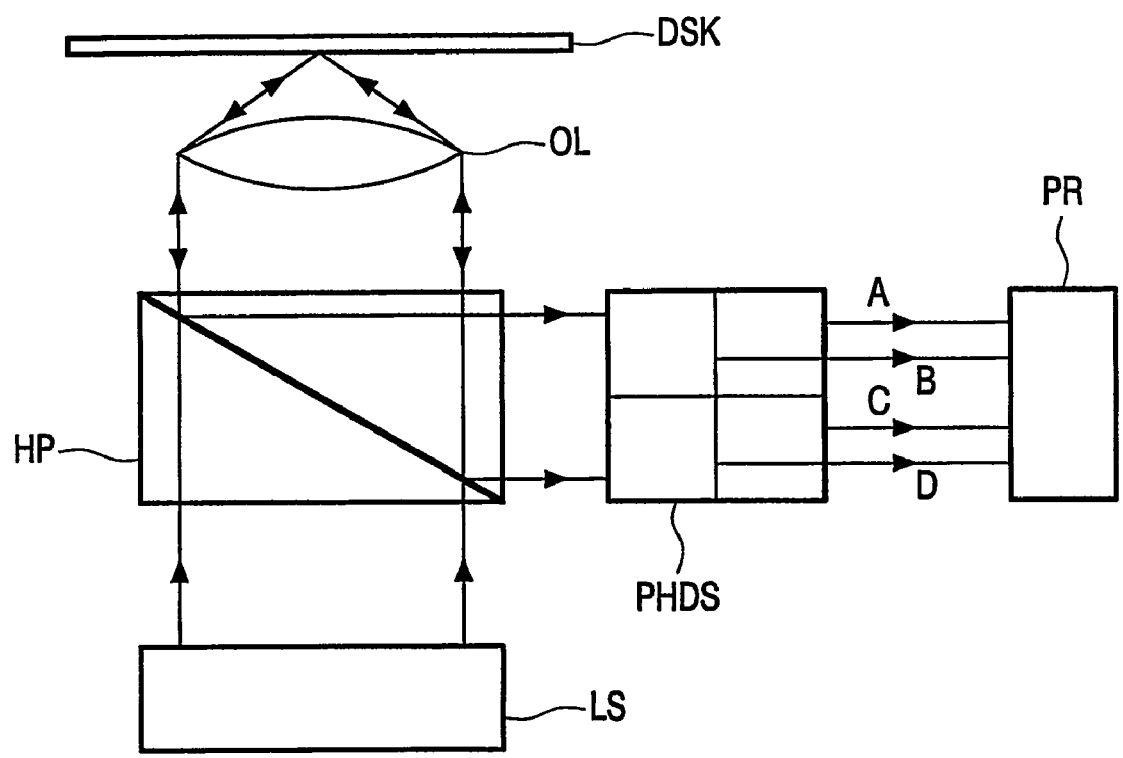
FIG. 1 is a simplified diagram of an optical disk drive apparatus in which the invention can be advantageously applied.
Figure 3:
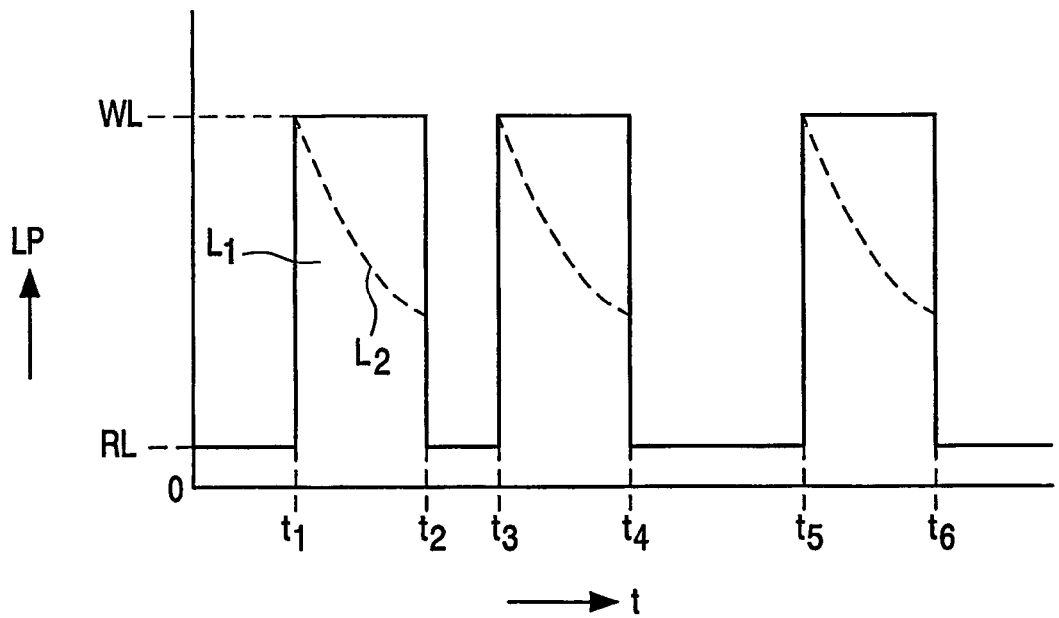
FIG. 3 shows a signal diagram of the laser light power and the reflected laser light power of the optical disk drive apparatus in the recording mode.

The recording mode will be further explained with reference to FIGS. 1 and 3. High intensity laser pulses $L_1$ are focused on the optical disk DSK The maximum value of the laser power LP of the laser pulses $L_1$ is denoted WL ("Write Level"). The reflected light power is denoted light "pulse" $L_2$. During a laser pulse $L_1$ the reflected light "pulse" $L_2$ decreases. See, for example, the time period between moments $t_1$ and $t_2$. This provides the possibility of controlling the reflectivity by measuring the reflected light "pulses" $L_2$. In between the laser pulses $L_1$, information (like in reading mode) must also be read in order to acquire tracking information, etcetera. So this information is read, for example, between moments $t_2$ and $t_3$. The value of the laser power LP of the laser pulses $L_1$ is then much less. This value is denoted RL ("Read Level").

In the recording mode, therefore, reflected light with high intensity as well as reflected light with low intensity must be processed by the processing means PR. As a consequence the dynamic range of one or more of the 4 signals A, B, C, and D may be very wide. This can cause problems with amplifier stages implemented in the processing means PR, because it imposes very high settling requirements on the amplifier stages. For further elucidation of this problem, which is solved by the application of the invention, reference is now also made to FIG. 2. Only the signal A delivered by the photo diodes PHDS is further discussed by way of example. The recording mode of the optical disk drive apparatus will only be discussed below.

Figure 2:
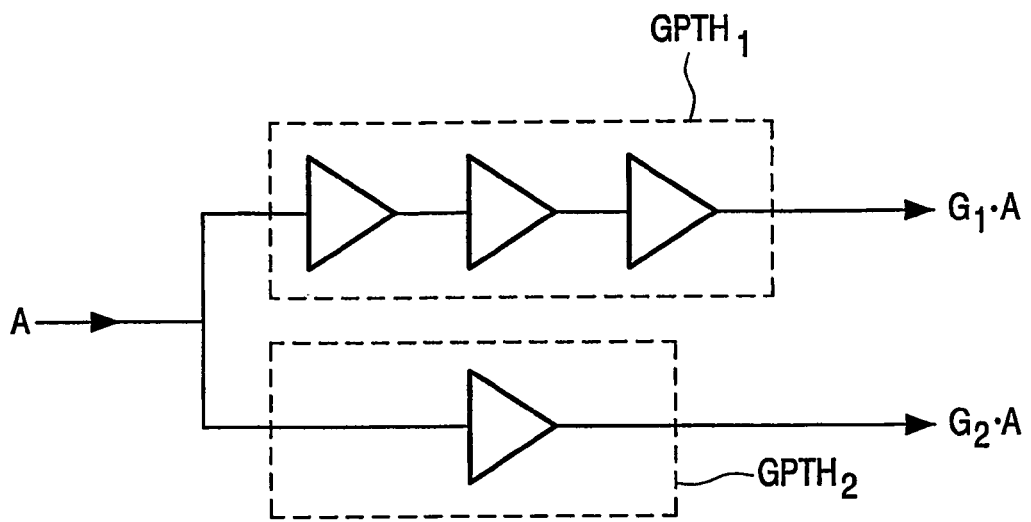
FIG. 2 show different gain paths for the handling of a signal from photo diodes.

FIG. 2 shows a first gain path $GPTH_1$ having a relatively high gain factor $G_1$, and a second gain path $GPTH_2$ having a relatively low gain factor $G_2$. The first gain path $GPTH_1$ serves to amplify the weak signals (at "RL" level) in between the high-intensity laser pulses $L_1$. The second gain path $GPTH_2$ serves to amplify the reflected light "pulses" $L_2$ which have a much greater intensity. During the processing of the strong signals, for example between moments $t_1$ and $t_2$, one or more amplifier stages in the first gain path $GPTH_1$ will be overdriven. Unless special measures are taken, this will cause one or more bipolar transistors (if implemented) to go into saturation, or cause one or more field effect transistors (if implemented) to go out of saturation. If the amplitude of signal A decreases after such an overdrive has occurred, for example between moments $t_2$ and $t_3$, the first gain path $GPTH_1$ should recover quickly in order to amplify the weak signal A fully within a short amount of time. However, bipolar transistors need some time to come out of saturation, and field effect transistors need some time to go into saturation again. For this reason the first gain path $GPTH_1$ needs some time to recover. This recovery time reduces the maximum recording speed of the optical disk drive apparatus, and is thus undesirable.

The maximum recording speed can be increased significantly by the application of the inventive electronic circuit having at least one inventive amplifier stage which is implemented in the first gain path $GPTH_1$.

Figure 4:
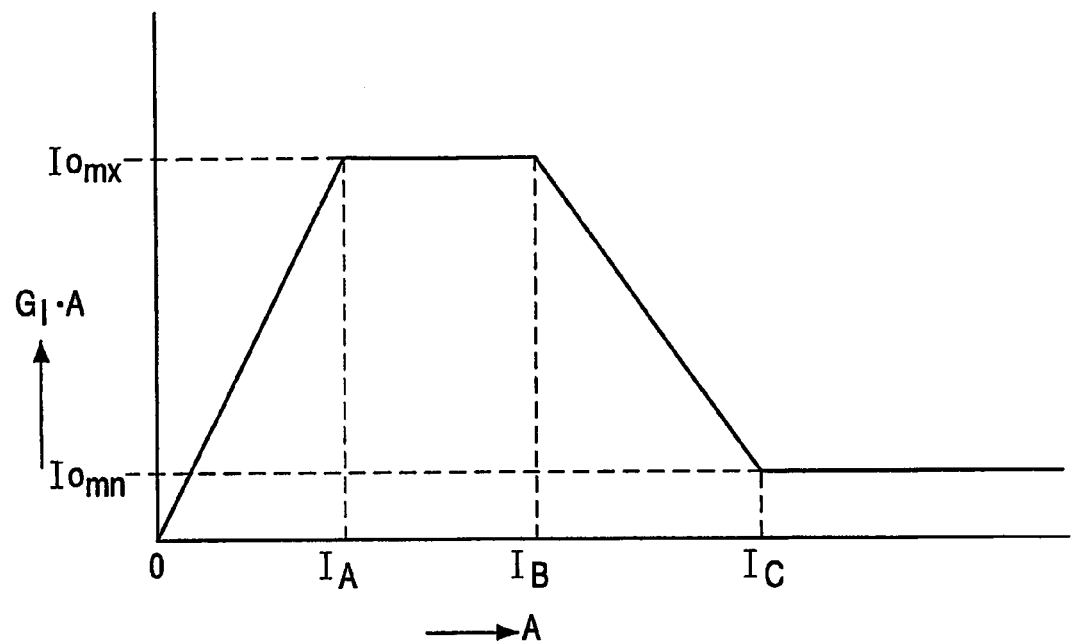
FIGS. 4 and 5 show signal diagrams for explaining the principles of the invention.

FIG. 4 shows a signal diagram for clarifying the principles of the invention. The signal diagram represents the signal transfer function $G_1$ of an inventive amplifier stage in which the signal A forms the input signal of the amplifier stage and $G_1 \cdot A$ is the output signal of the amplifier stage. As long as the amplitude of the input signal A is no higher than an input reference level $I_A$, the amplifier stage is in a so-called normal mode. The output signal $G_1 \cdot A$ is then approximately constant in this example. Thus the input signal A is linearly amplified. (It is to be noted, however, that a linear amplification in this normal mode, although desirable in many applications, is not a necessity.) The value of the input reference level $I_A$ must be chosen such that it is equal to or higher than the maximum amplitude of the weak signals (at "RL" level) in between the high-intensity laser pulses $L_1$.

During a laser pulse $L_1$ the reflected light "pulse" $L_2$ which is now represented by the input signal A has an amplitude which is higher than the input reference level $I_A$. (These reflected light "pulses" $L_2$ are monitored via the second gain path $GPTH_2$.) If the amplitude is not higher than a further input reference level $I_B$, however, the amplifier stage is in a so called clipping mode. The output signal $G_1 \cdot A$ is then approximately kept constant in this example. If the amplitude of the input signal A exceeds the further input reference level $I_B$, the amplifier stage is in a so-called fold-back mode. Preferably, in the fold-back mode, a minimum value for the amplitude of the output signal $G_1 \cdot A$ must be set. This minimum value is denoted an output reference level $Io_{mn}$. When the amplitude of the input signal A is so strong that the amplitude of the output signal has reached the output reference level $Io_{mn}$, the amplifier stage is in a so-called minimum fold-back mode. Thus this occurs when the input signal A exceeds an even further input reference level $I_C$.

Figure 5:
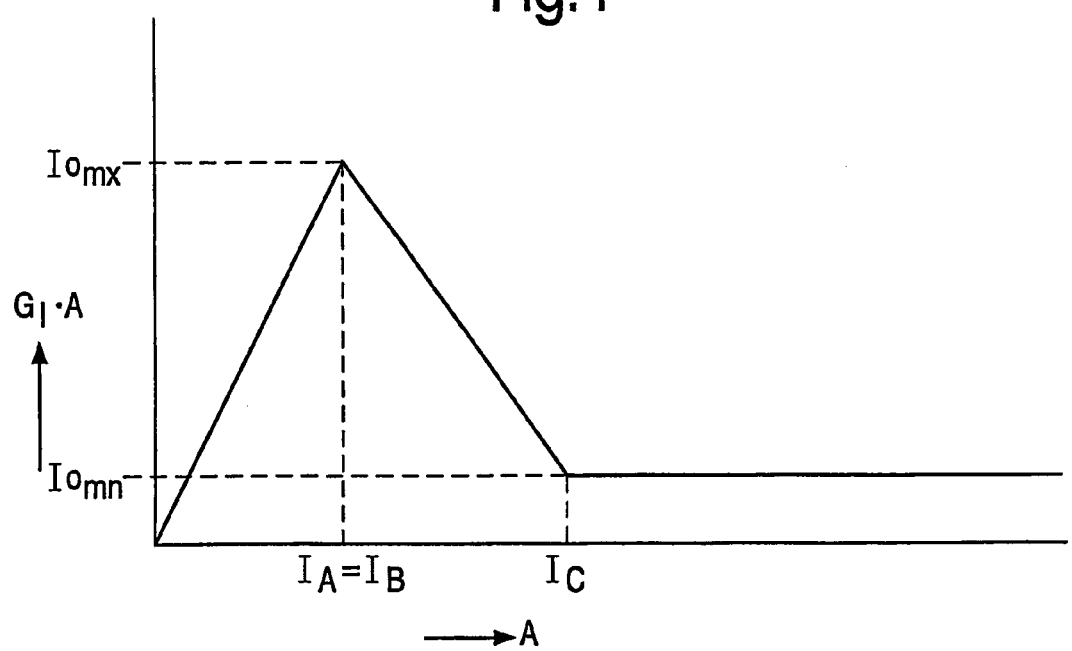

FIG. 5 shows a signal diagram which differs from the signal diagram as shown in FIG. 4 in that the further input reference level $I_B$ equals the input reference level $I_A$. The amplifier stage then immediately enters the (minimum) fold-back mode when the input signal A exceeds the input reference level $I_A$.

Figure 6:
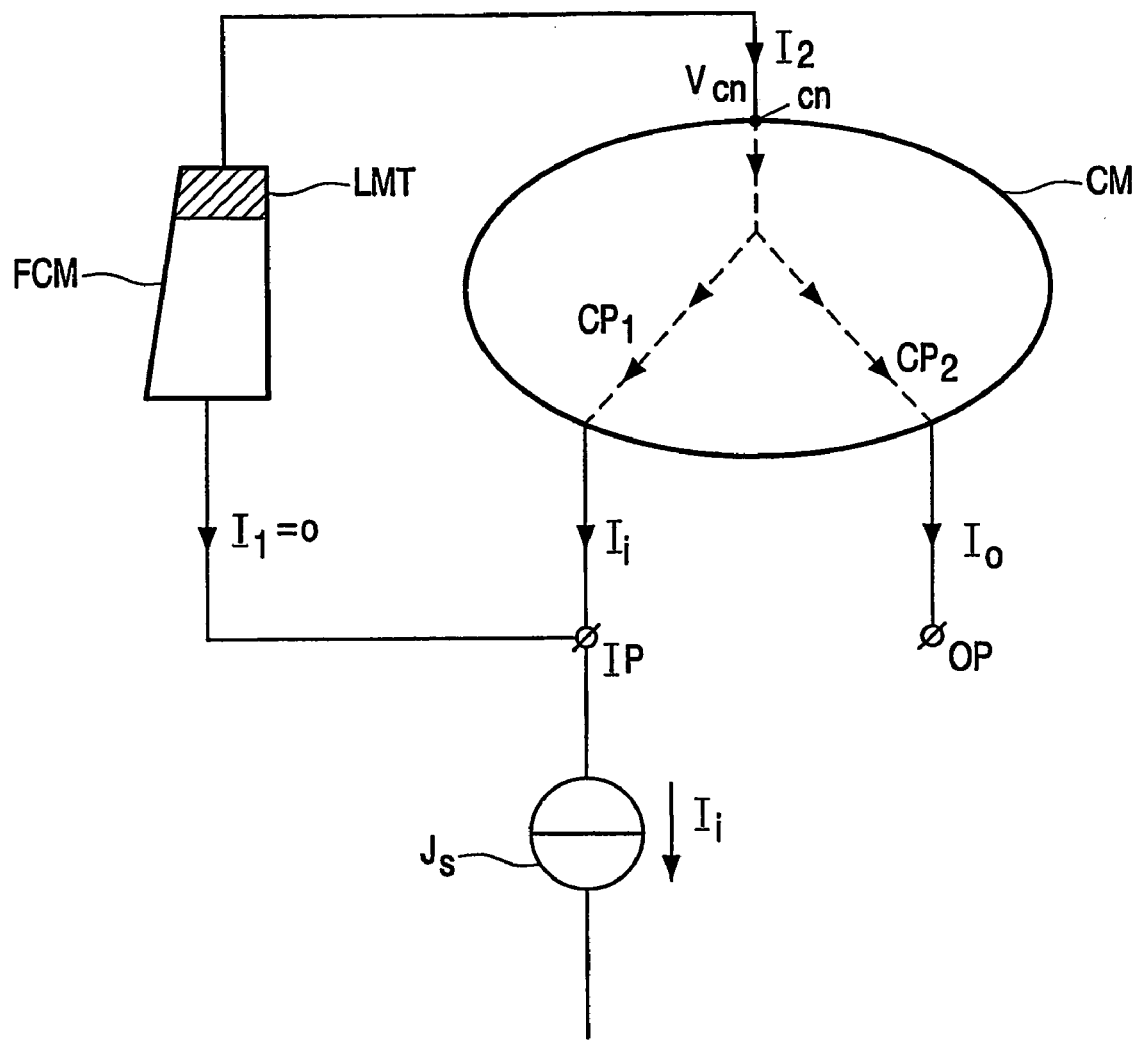
FIGS. 6 and 7 are diagrams showing parts of an inventive amplifier stage for giving an introductory explanation of the invention in broad terms.

FIG. 6 shows an amplifier stage AMPST comprising a current mirror CM having an input IP, an output OP, and a common node cn. The current mirror CM comprises a first current path $CP_1$ coupled between the input IP and the common node cn and a second current path $CP_2$ coupled between the output OP and the common node cn. The amplifier stage AMPST further comprises first control means FCM which comprises limiting means LMT. The first control means FCM is connected between the input IP and the common node cn. An input current source $J_S$ which supplies a current $I_i$ is connected to the input IP. The input current source $J_S$ represents, for example, the photo diodes PHDS (see FIG. 1) such that the current $I_i$ represents a combination of the 4 signals A, B, C, and D, for example the signal A. The first control means FCM controls a voltage $V_{cn}$ at the common node cn and supplies a current $I_2$ to the common node cn. The current $I_2$ feeds the first and second current paths $CP_1$ and $CP_2$. Since, in this example, an input current $I_1$ of the first control means FCM equals zero, the value of the current in the first current path $CP_1$ equals the value of the current $I_i$. The current $I_o$ in the second current path $CP_2$ forms the output current of the amplifier stage AMPST.

If the amplifier stage AMPST is in the normal mode, the current $I_i$ is (linearly) amplified into the output current $I_o$. The value of the amplification is determined by a so-called current mirror ratio which is defined by the current paths $CP_1$ and $CP_2$. When the amplifier stage AMPST enters the clipping mode (or the fold-back mode in the situation as shown in FIG. 5) the limiting means LMT limits the value of the current $I_2$. This occurs when the amplitude of the input signal $I_i$ exceeds the input reference level $I_A$ (see FIGS. 4 and 5). As a consequence both the currents $I_i$ and $I_o$ are limited. The maximum value for the current $I_o$ corresponds to the value $Io_{mx}$ as indicated in FIGS. 4 and 5. Since the current $I_i$ is also limited (and the current $I_1$ equals zero), the input current is also limited and is thus no longer fully dictated by the current source $J_S$. It means in fact a saturation situation of the signal current source $J_S$.

Figure 7:
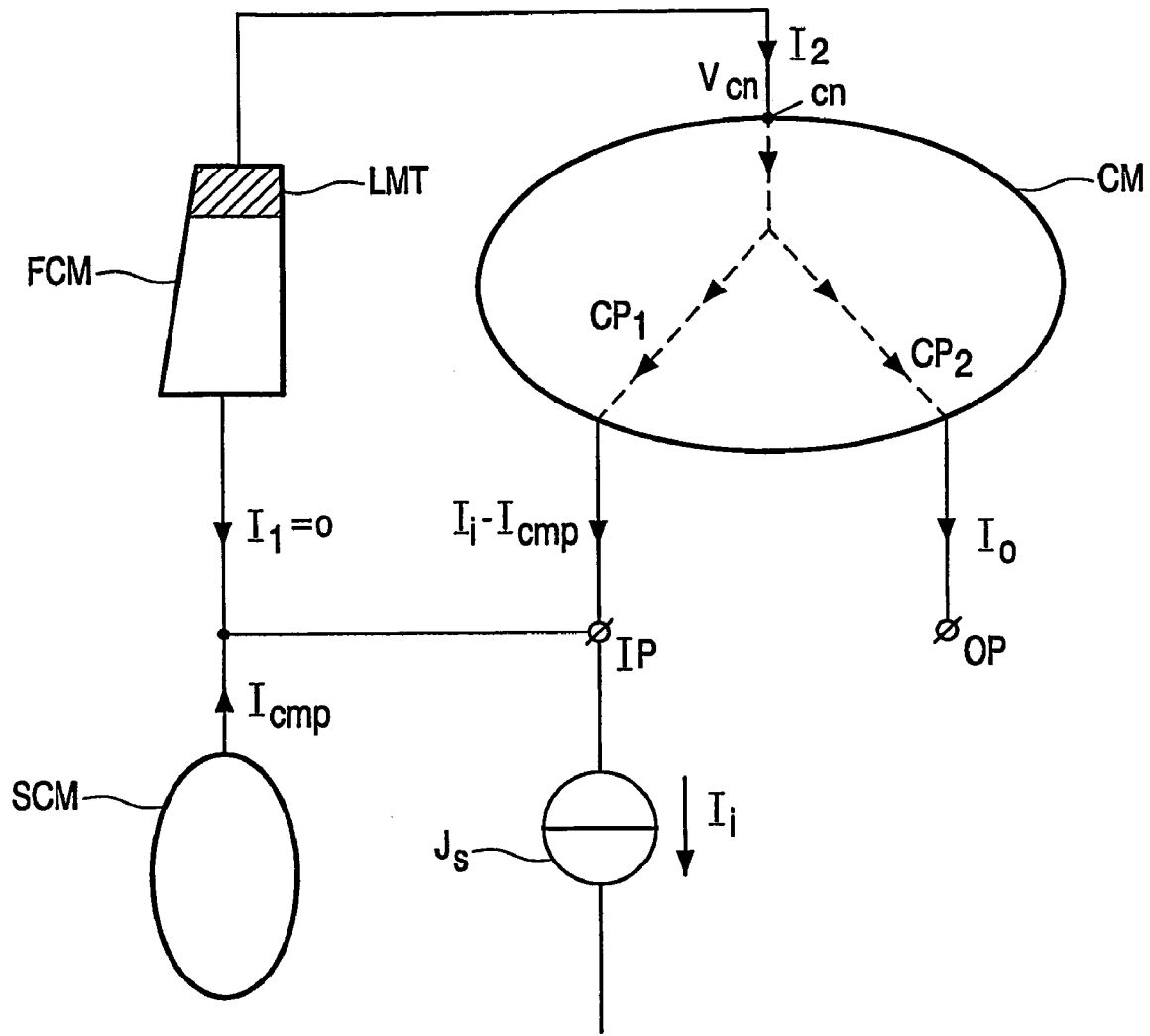

FIG. 7 shows an amplifier stage AMPST which differs from the one shown in FIG. 6 in that it further comprises second control means SCM for supplying a compensation current $I_{cmp}$ to the input IP when the strength of the input signal $I_i$ has exceeded the input reference level $I_A$. This prevents said saturation situation of the signal current source $J_S$.

Figure 8:
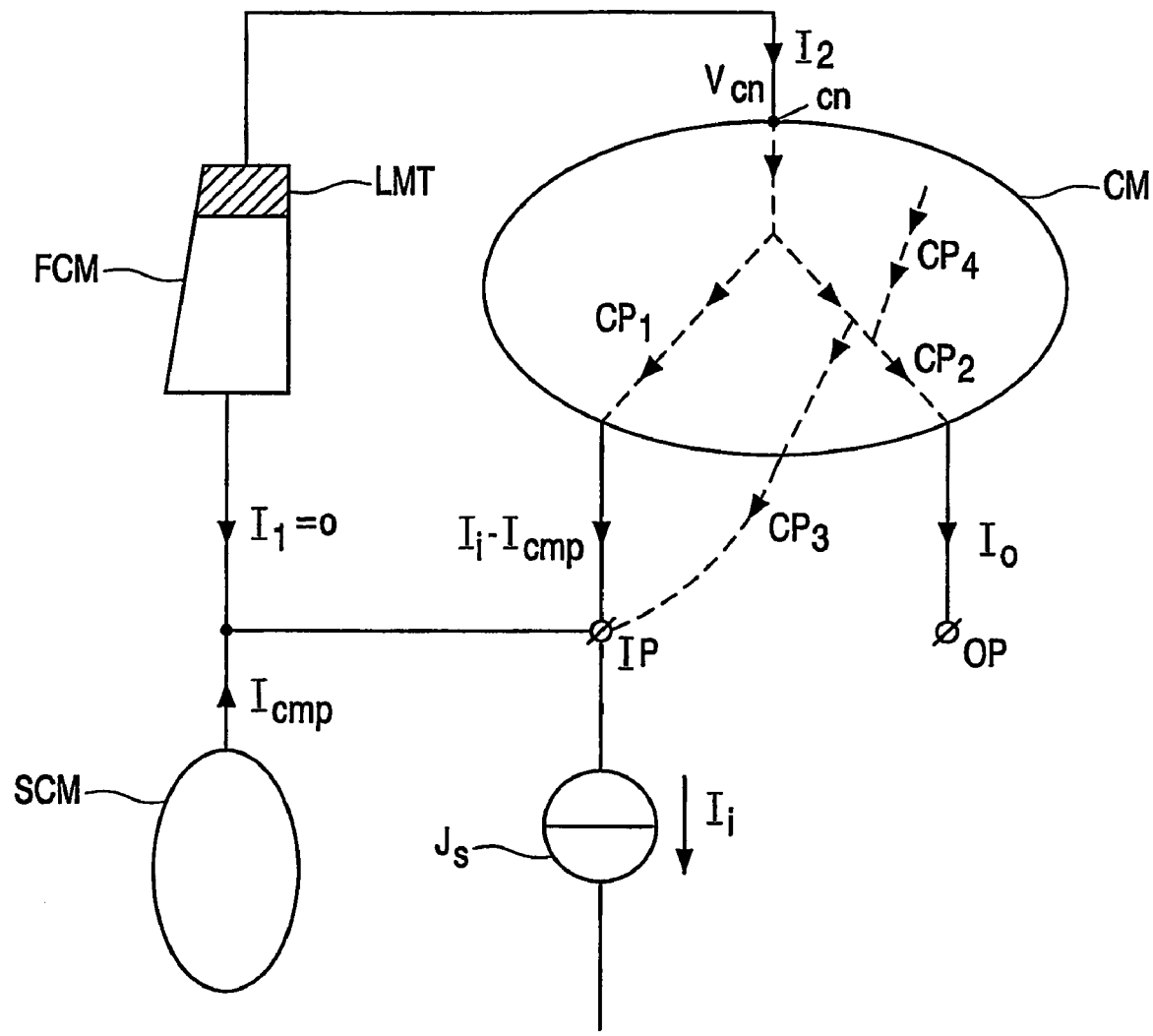
FIG. 8 shows an embodiment of the inventive amplifier stage in broad terms.

FIG. 8 shows an amplifier stage AMPST which differs from the one shown in FIG. 7 in that it further comprises a third current path $CP_3$ having a first side coupled to the input IP and a second side coupled to the second current path $CP_2$; and a fourth current path $CP_4$ coupled to the second current path $CP_2$.

The third current path $CP_3$ takes away current from the second current path $CP_2$ so that the amplitude of the output current $I_o$ decreases in response to an increasing strength of the input signal $I_i$ when the amplifier stage AMPST is in the fold-back mode. This occurs when the amplitude of the input signal $I_i$ has exceeded the further input reference level $I_B$ (see FIGS. 4 and 5).

The fourth current path $CP_4$ supplies current to the second current path $CP_2$ when the amplitude of the input signal $I_i$ has exceeded an even further input reference level $I_C$ (see FIGS. 4 and 5). This implements the minimum fold-back mode in which the value of the output current $I_o$ cannot become lower than the output reference level $Io_{mn}$.

Figure 9:
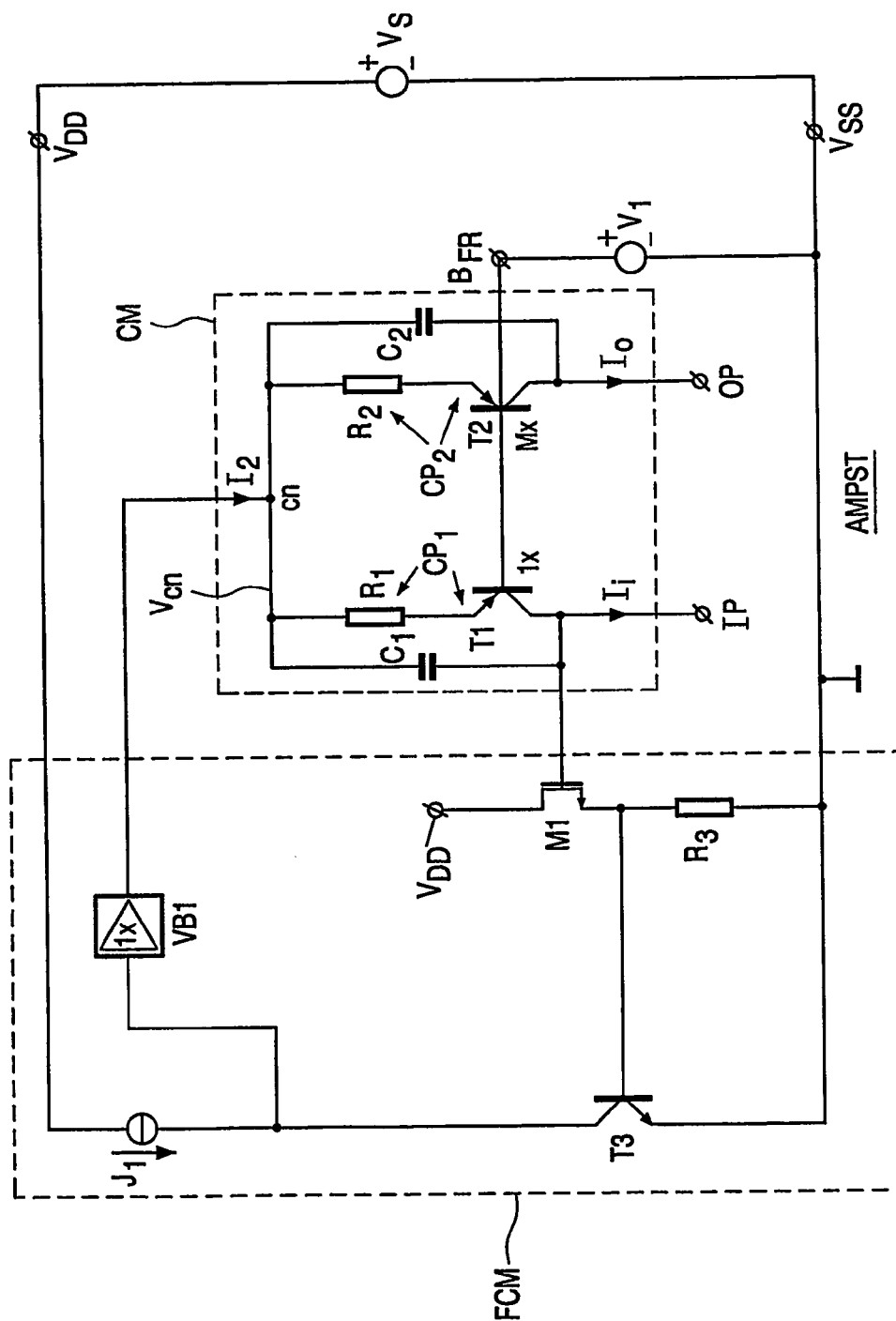
FIGS. 9–13 are detailed electronic diagrams of parts of the inventive amplifier stage.

FIG. 9 shows an electronic circuit comprising an amplifier stage AMPST which comprises the first control means FCM and the current mirror CM having the input IP, the output OP, and the common node cn. The amplifier stage AMPST is powered by a voltage source $V_S$ which is connected between a first power supply terminal $V_{DD}$ and a second power supply terminal $V_{SS}$ of the amplifier stage AMPST. Input and output currents of the amplifier stage AMPST are denoted $I_i$ and $I_o$, respectively. The current mirror CM comprises bipolar transistors $T_1$ and $T_2$, each having a base, an emitter, and a collector, resistors $R_1$ and $R_2$; and capacitors $C_1$ and $C_2$. The bases of transistors $T_1$ and $T_2$ are connected to a reference terminal $B_{RF}$. A voltage source $V_1$ is connected between the reference terminal $B_{RF}$ and the second power supply terminal $V_{SS}$. The collectors of transistors $T_1$ and $T_2$ are connected to the input IP and output OP, respectively. The resistor $R_1$ is connected between the common node cn and the emitter of transistor $T_1$. The resistor $R_2$ is connected between the common node cn and the emitter of transistor $T_2$. The capacitor $C_1$ is connected between the common node cn and the collector of the transistor $T_1$. The capacitor $C_2$ is connected between the common node cn and the collector of the transistor $T_2$. Transistor $T_1$ and resistor $R_1$ (and optionally also capacitor $C_1$) together form the first current path $CP_i$. Transistor $T_2$ and resistor $R_2$ (and optionally also capacitor $C_2$) together form the second current path $CP_2$.

The first control means FCM comprises bipolar transistor $T_3$ having a base, an emitter, and a collector; field effect transistor $M_1$ having a gate, a source, and a drain; resistor $R_3$; current source $J_1$; and buffer VB1 having an input and an output. The drain of transistor $M_1$ is connected to the first power supply terminal $V_{DD}$. The gate of transistor $M_1$ is connected to the input IP. The resistor $R_3$ is connected between the source of transistor $M_1$ and the second power supply terminal $V_{SS}$. The base of transistor $T_3$ is connected to the source of transistor $M_1$. The emitter of transistor $T_3$ is connected to the second power supply terminal $V_{SS}$. The input of buffer VB1 is connected to the collector of transistor $T_3$. The output of buffer VB1 is connected to the common node cn. The current source $J_1$ is connected between the first power supply terminal $V_{DD}$ and the input of the buffer VB1.

The voltage source $V_1$ serves to supply a DC biasing voltage at the bases of transistors $T_1$ and $T_2$. Transistor $M_1$ and resistor $R_3$ together form a so-called source follower. The current mirror CM, the source follower, transistor $T_3$ which is biased by the current source $J_1$, and the buffer VB1 together form a so-called feedback loop. This feedback loop controls the voltage $V_{cn}$ at the common node cn. It also controls the current $I_2$ to the common node cn. The collector current of transistor $T_1$ equals the input current $I_i$. Preferably, the current mirror CM is dimensioned as follows: the emitter area of transistor $T_2$ is M times the emitter area of transistor $T_1$, the value of resistor $R_1$ is M times the value of resistor $R_2$, and the value of capacitor $C_2$ is M times as the value of capacitor $C_1$. Capacitors $C_1$ and $C_2$ improve the HF-behaviour of the current mirror CM. If the output OP is terminated with a relatively low impedance, especially for HF, (for example because it is coupled to another current mirror), then the value of the output current $I_o$, is approximately M times the value of the input current $I_i$. (M may be smaller than, equal to, or greater than 1). The current $I_2$ is limited by the buffer VB1 in order to create the clipping mode.

Figure 10:
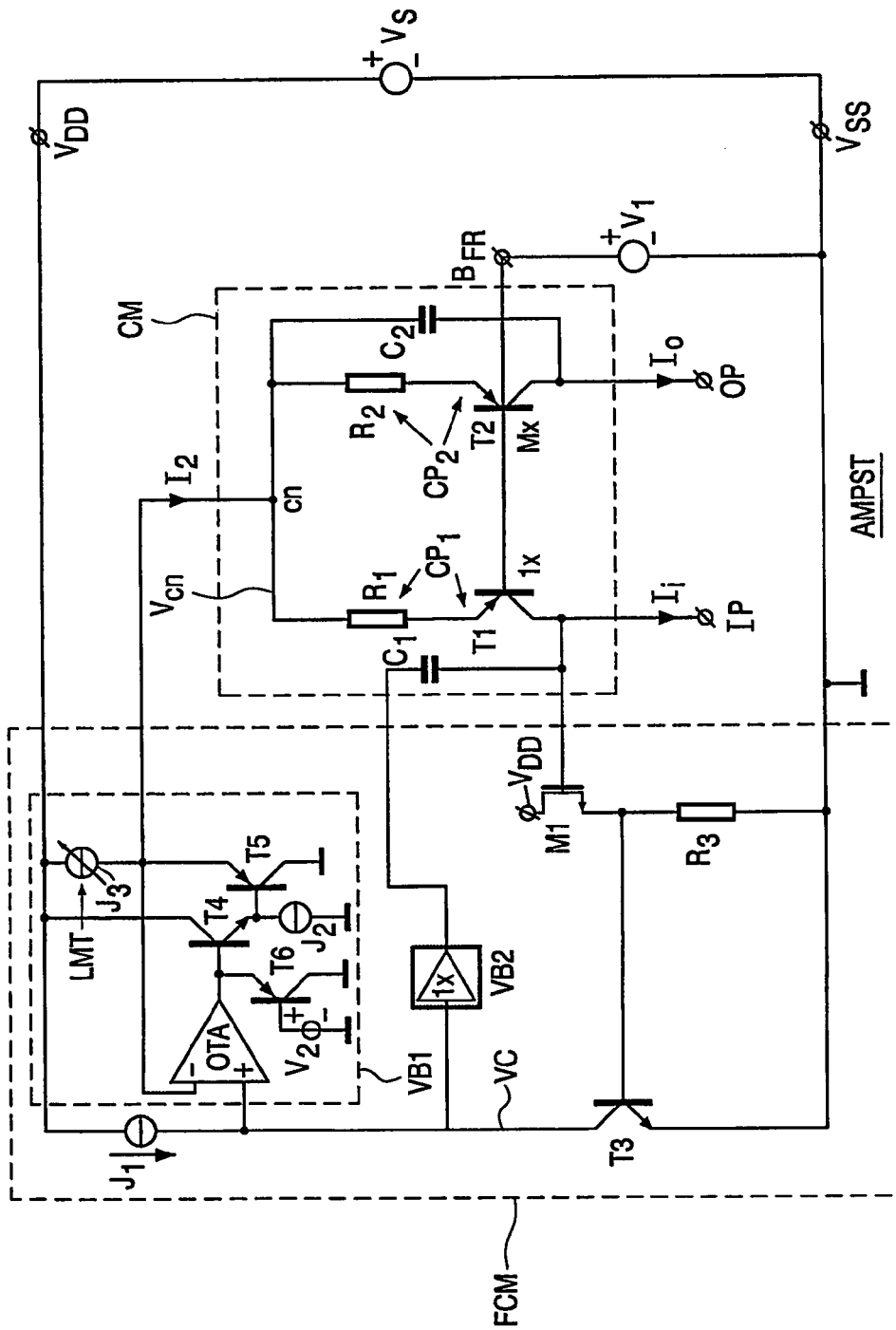

FIG. 10 shows an electronic circuit comprising an amplifier stage AMPST which differs from the one shown in FIG. 9 in that it further comprises a buffer VB2 having an input connected to the collector of transistor $T_3$, and an output, and in that the capacitor $C_1$ is connected to the output of the buffer VB2 instead of to the common node cn. Furthermore, an implementation of the buffer VB1 is disclosed.

The buffer VB1 comprises an OTA (operational transconductance amplifier) having a non-inverting input connected to the collector of transistor $T_3$, an inverting input connected to the common node cn, and an output; fourth, fifth, and sixth bipolar transistors $T_4$–$T_6$ each having a base, an emitter, and a collector; a voltage source $V_2$ connected between the base of transistor $T_6$ and the second power supply terminal $V_{SS}$; a current source $J_2$ connected between the emitter of transistor $T_4$ and the second power supply terminal $V_{SS}$; and a current source $J_3$ connected between the first power supply terminal $V_{DD}$ and the emitter of transistor $T_5$. The collectors of transistors $T_5$ and $T_6$ are connected to the second power supply terminal $V_{SS}$. The emitter of transistor $T_6$ and the base of transistor $T_4$ are connected to the output of the OTA. The base of transistor $T_5$ is connected to the emitter of transistor $T_4$. The emitter of transistor $T_5$ is connected to the common node cn. The collector of transistor $T_4$ is connected to the first power supply terminal $V_{DD}$.

Bipolar transistors $T_4$ and $T_5$, together with current sources $J_2$ and $J_3$ which supply current through the transistors $T_4$ and $T_5$, and the OTA together form a so-called improved "emitter follower". (The improvement relates to the operation of the "emitter follower" even at very low currents.) The current source $J_3$ also supplies the current $I_2$ to the common node cn. In the normal mode a voltage VC at the collector of transistor $T_3$ equals the voltage $V_{cn}$ at the common node cn. In this example the limiting means LMT within the first control means FCM is performed by the current source $J_3$.

In the clipping mode the voltage at the non-inverting input, the inverting input, and the output of the OTA rises significantly. In order to prevent a saturation situation of the OTA, the maximum voltage at the output of the OTA is limited by the presence of transistor $T_6$ and the voltage source $V_2$. This is because the transistor $T_6$ will significantly conduct current if its base-emitter voltage is more than approximately 0.6 V. (This voltage can be slighty different depending on the type of transistor used.) So if, for example, it is undesirable that the voltage at the output of the OTA exceeds 2.5 V, the voltage which must be supplied by the voltage source $V_2$ must not be larger than 1.9 V (2.5 V–0.6 V).

For HF, the buffer VB1 is bypassed by the buffer VB2 and the capacitor $C_1$. The feedback loop is kept stable thereby, that is to say no slew rate oscillations will occur in the clipping mode, neither will they in the normal mode when the amplifier stage has come out of the clipping mode.

Figure 11:
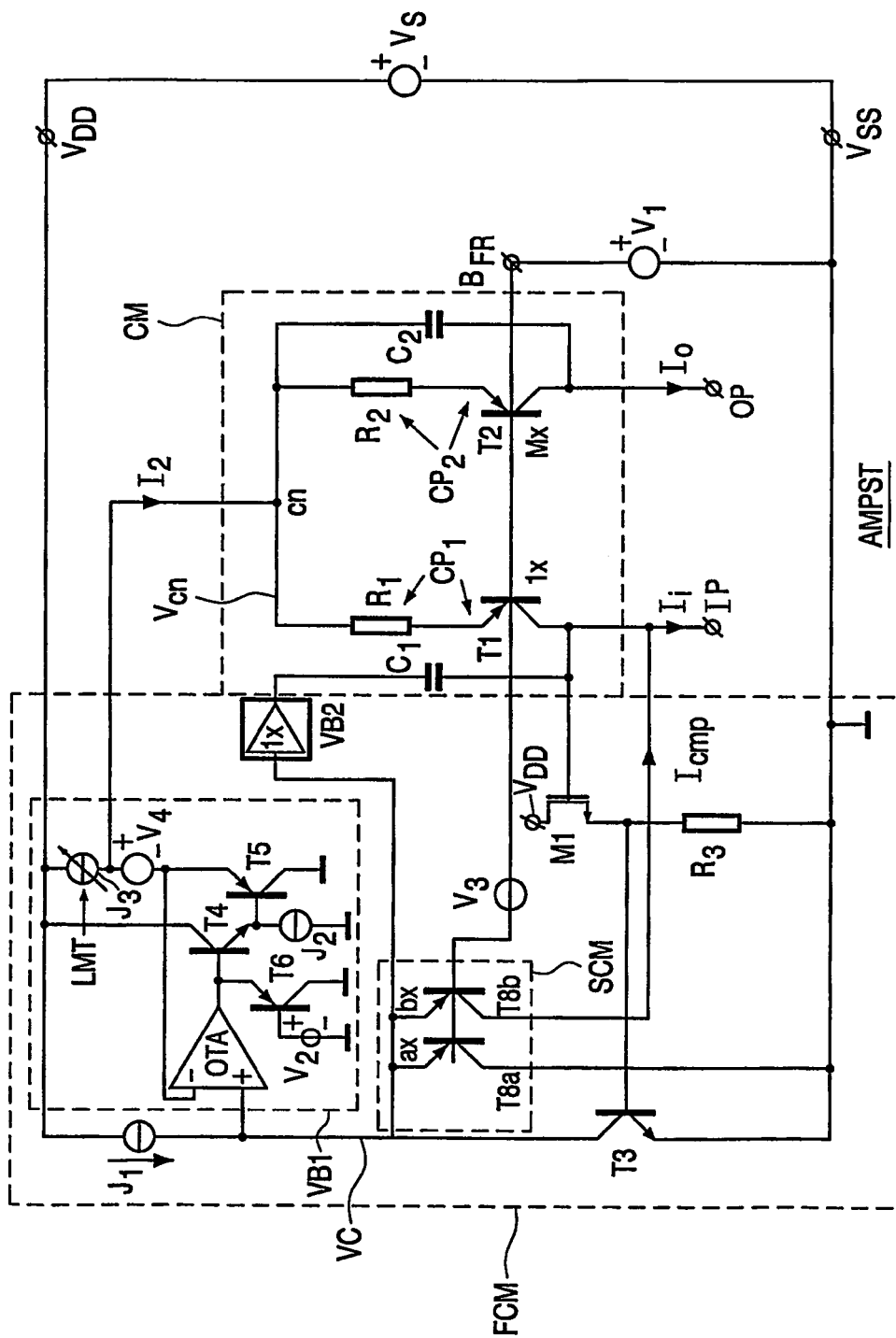

FIG. 11 shows an electronic circuit comprising an amplifier stage AMPST which differs from the one shown in FIG. 10 in that it further comprises second control means SCM comprising bipolar transistors $T_{8a}$ and $T_{8b}$, each having a base, an emitter, and a collector; a voltage source $V_3$; and a voltage source $V_4$. The emitters of transistors $T_{8a}$ and $T_{8b}$ are connected to the collector of transistor $T_3$. The collector of transistor $T_{8a}$ is connected to the second power supply terminal $V_{SS}$. The collector of transistor $T_{8b}$ is connected to the input IP. The bases of transistors $T_{8a}$ and $T_{8b}$ are connected to each other. The voltage source $V_3$ is connected between the reference terminal $B_{RF}$ and the bases of transistors $T_{8a}$ and $T_{8b}$. The voltage source $V_4$ is connected at one side to the inverting input of the OTA and the emitter of transistor $T_5$, and to the current source $J_3$ and the common node cn at another side.

The purpose of the additional components with regard to the circuit of FIG. 10 is as follows. When the amplifier stage AMPST enters the clipping mode, the so-called small signal loop gain of the feedback loop drops to a very low value. Without the presence of the second control means SCM the voltage VC would tend to rise towards the potential at the first supply terminal $V_{DD}$. This would turn the current source $J_1$ into saturation. This is prevented, however, by the second control means SCM. When the voltage VC exceeds a certain value, the transistors $T_{8a}$ and $T_{8b}$ start to conduct current. This has the effect that the rise of the voltage VC is restrained. The collector current of transistor $T_{8b}$ is used as the compensation current $I_{cmp}$ (see FIGS. 7 and 8). The dimensioning of the transistors $T_{8a}$ and $T_{8b}$ (e.g. the emitter ratio ax/bx=a/b as indicated in FIG. 11) and the voltage delivered by the voltage source $V_3$ are preferably such that the input reference level $I_A$ (see FIGS. 4 and 5) is still determined by the current $I_2$. With the presence of the voltage source $V_4$ the voltages $V_{cn}$ and the voltage VC can be chosen differently. A higher degree of flexibility in dimensioning the amplifier stage AMPST is made possible thereby.

The second control means SCM in fact reduces the small signal loop gain of the feedback loop when the amplifier stage AMPST enters the clipping mode. The amount of reduction of the small signal loop gain is determined by the emitter ratio a/b. The higher the emitter ratio a/b, the higher the reduction in the small signal loop gain. A high reduction of the small signal loop gain is favorable for the stability of the feedback loop. It therefore also reduces HF-peaking in the transfer (current gain) of the amplifier stage AMPST. However, if the emitter ratio a/b is chosen too high, the current flowing through transistor $T_3$ will be too low, e.g. equal to zero. This would undesirably increase the recovery time of the amplifier stage AMPST.

Figure 12:
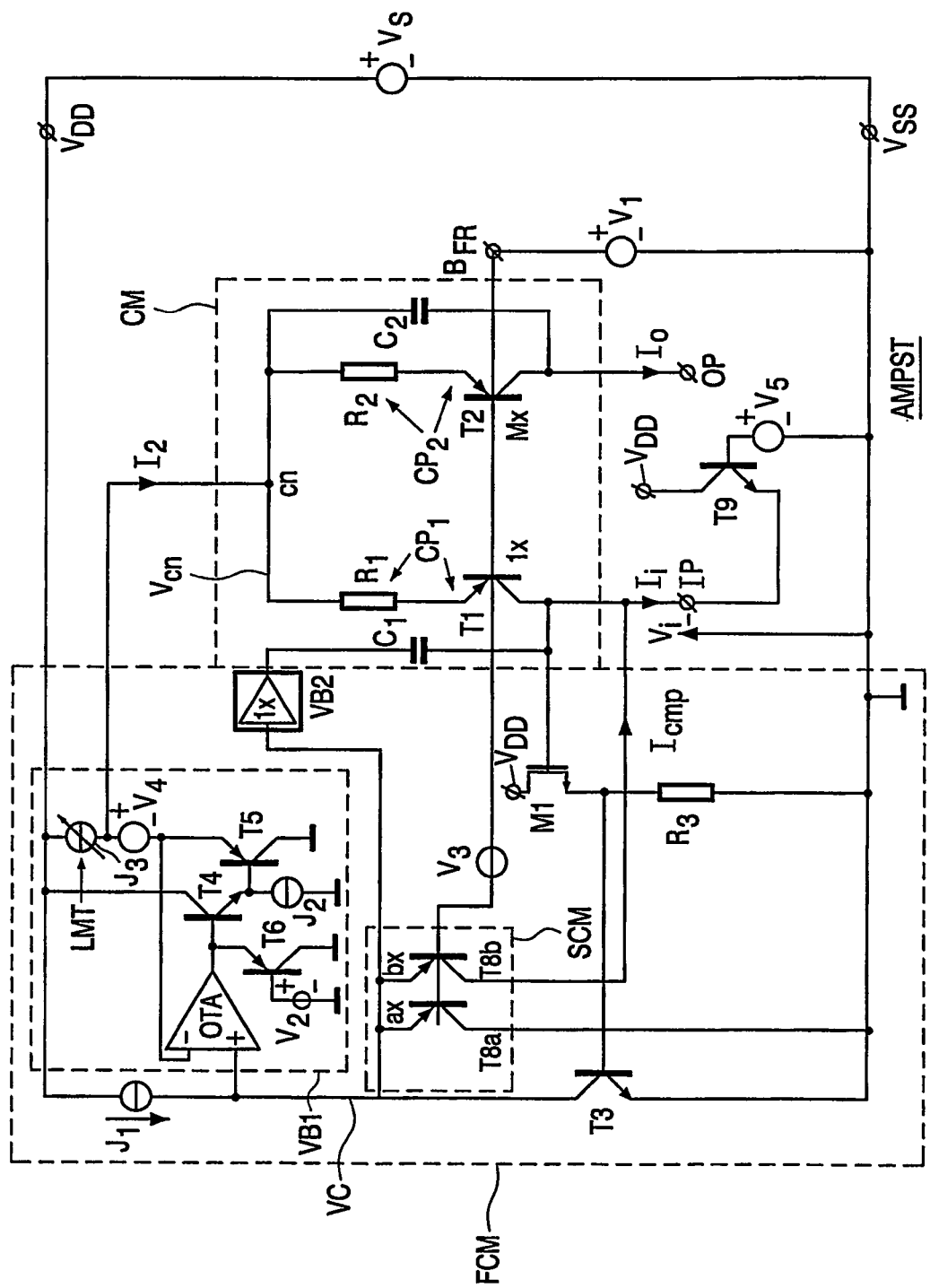

FIG. 12 shows an electronic circuit comprising an amplifier stage AMPST which differs from the one shown in FIG. 11 in that it further comprises a bipolar transistor $T_9$ having a base, an emitter connected to the input IP, and a collector connected to the first power supply terminal $V_{DD}$; and a voltage source $V_5$ connected between the base of the transistor $T_9$ and the second power supply terminal $V_{SS}$.

Transistor $T_9$ functions as an input clamp for clamping an input voltage $V_i$ at the input 1P. Thus the input voltage $V_i$ cannot become lower than the voltage delivered by the voltage source $V_5$ minus the base-emitter voltage of transistor $T_9$. As a consequence the base-emitter voltage of transistor $T_3$ cannot become too low, and a too low current through transistor $T_3$ is thus prevented. It means in fact that the input voltage $V_i$ is reduced by a certain amount when the amplifier stage AMPST is not in the normal mode.

The voltage delivered by the voltage source $V_5$ is preferably dimensioned such that, when the amplifier stage AMPST is in the normal mode, the transistor $T_9$ virtually does not conduct any current. In order to achieve this it is recommended to track the voltage delivered by the voltage source $V_5$ over temperature effects and/or processing effects (if the amplifier stage AMPST is implemented in an IC). The voltage source $V_5$ may be implemented, for example, by stacking two "diode voltages" and a gate-source voltage of a field effect transistor. The two "diode voltages" may be implemented, for example, by a so called "$V_{be}$ multiplier".

Figure 13:
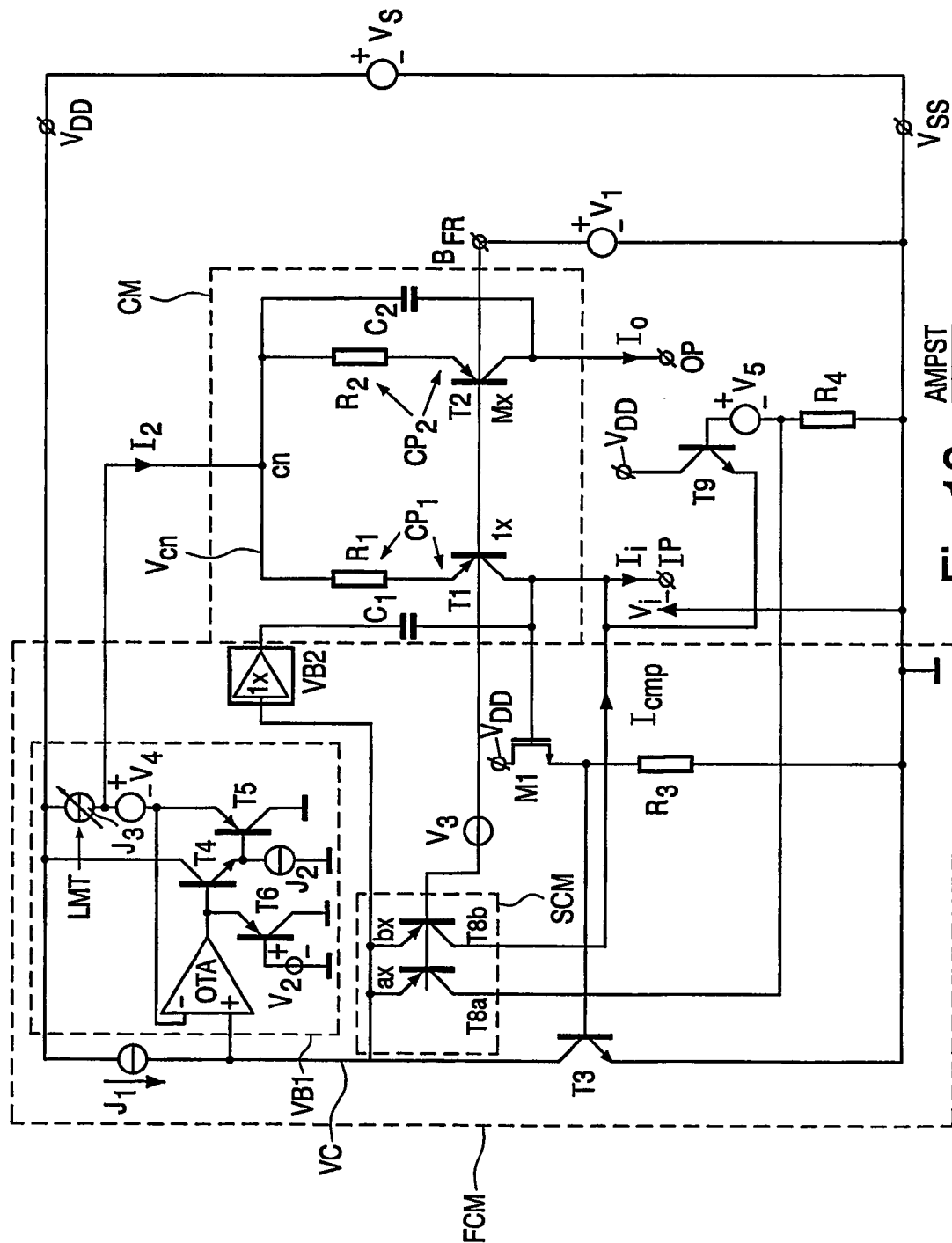

FIG. 13 shows an electronic circuit comprising an amplifier stage AMPST which differs from the one shown in FIG. 12 in that the voltage source $V_5$ is connected to the second power supply terminal $V_{SS}$ not directly, but via a resistor $R_4$, and in that the collector of transistor $T_{8a}$ is not connected to the second power supply terminal $V_{SS}$ but to a common junction of the voltage source $V_5$ and the resistor $R_4$.

The said reduction of the input voltage $V_i$ by a certain amount when the amplifier stage AMPST is not in the normal mode according to the electronic circuit as shown in FIG. 12 in fact means a voltage variation in the input voltage $V_i$. In principle this can increase the recovery time of the amplifier stage AMPST. Preferably, it should therefore be avoided. This is accomplished by the electronic circuit of FIG. 13. This is because the collector current of transistor $T_{8a}$ causes a voltage drop across the resistor $R_4$. As a consequence the voltage at the base of transistor $T_9$ is increased. Thus the required base-emitter voltage of transistor $T_9$ is now realized by increasing the voltage at the base of transistor $T_9$ instead of reducing the value of the input voltage $V_i$.

Alternatively, the order of the voltage source $V_5$ and the resistor $R_4$ may be reversed. Then the collector of transistor $T_{8a}$ should be connected to the base of the transistor $T_9$.

Figure 14:
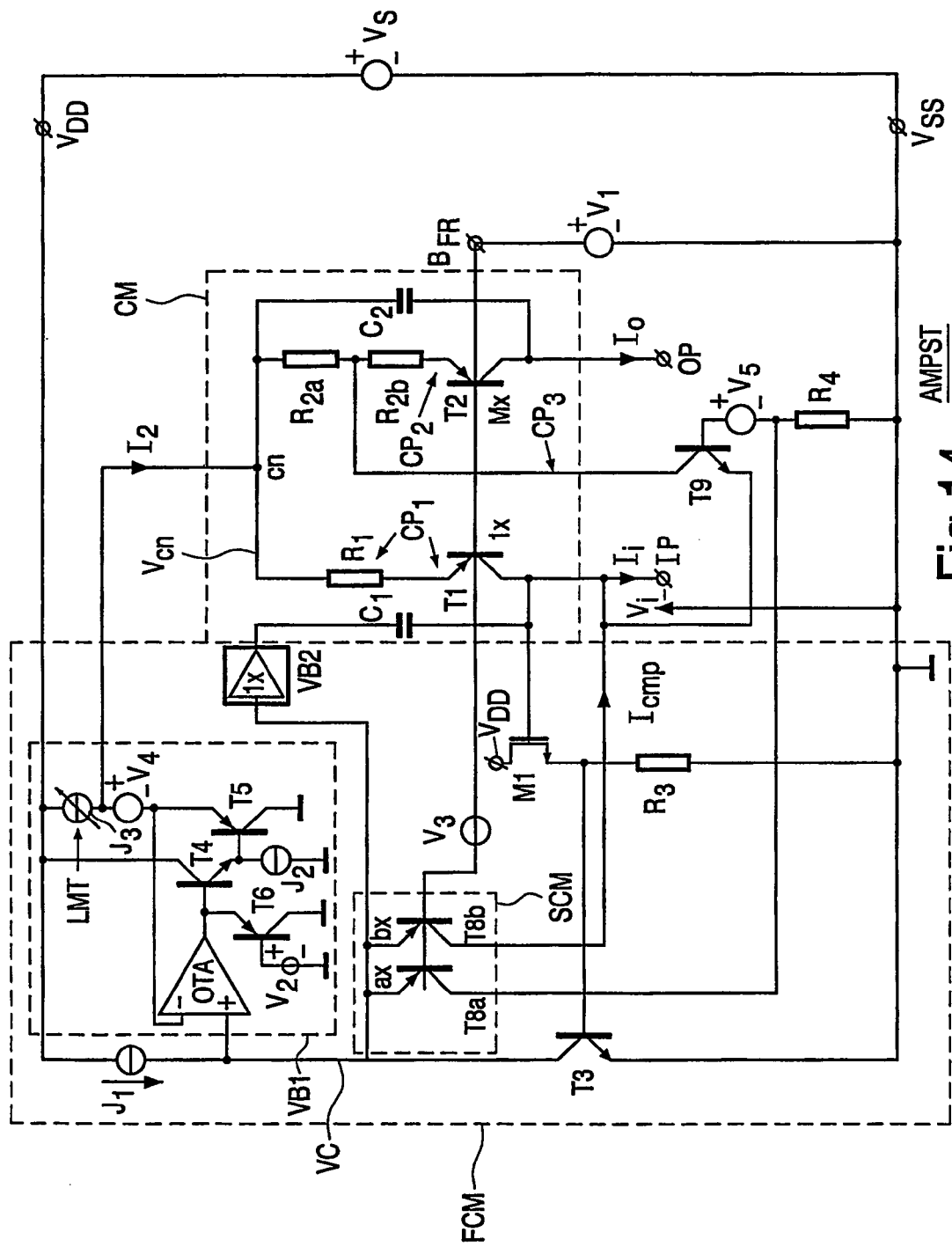
FIGS. 14–16 are detailed electronic diagrams of embodiments of the inventive amplifier stage.

FIG. 14 shows an electronic circuit comprising an amplifier stage AMPST which differs from the one shown in FIG. 13 in that the resistor $R_2$ is now represented by a series arrangement of resistors $R_{2a}$ and $R_{2b}$, and in that the collector of transistor $T_9$ is now not connected to the first power supply terminal $V_{DD}$ but to a common junction of the resistors $R_{2a}$ and $R_{2b}$.

The third current path $CP_3$, and thus the fold-back mode is thus implemented. When the amplitude of the input current $I_i$ exceeds the further input reference level $I_B$ (see FIGS. 4 and 5), the transistor $T_9$ takes away current from the second current path $CP_2$. As a consequence the value of the output current $I_o$ decreases with a further increasing value of the input current $I_i$. The ratio of the values of the resistors $R_{2a}$ and $R_{2b}$ is preferably to be determined such that the transistor $T_9$ will never go into saturation. It may turn out that an appropriate value of the resistor $R_{2b}$ equals zero. In that case the collector of the transistor $T_9$ is in fact connected to the common connection point of the resistor $R_2$ and the emitter of the transistor $T_2$ (see FIG. 13).

In order to implement the minimum fold-back mode in which the value of the output current cannot become lower than a minimum value, which minimum value is referred to as the output reference level $Io_{mn}$ (see FIGS. 4 and 5), some additional measure has to be taken. This measure could be, for example, that the ratio of the values of the resistors $R_{2a}$ and $R_{2b}$ is chosen such that at a certain value of the output current $I_O$ (which is the output reference level $Io_{mn}$) the collector-emitter voltage of the transistor $T_9$ has become so low that the transistor $T_9$ goes into saturation, and thus its collector current cannot increase any further. In practice, however, it is not always possible to find an appropriate ratio of the values of the resistors $R_{2a}$ and $R_{2b}$ for getting this result without conflicting with other dimensioning requirements for the amplifier stage AMPST. Furthermore, as was noted above, a saturation situation of the transistor $T_9$ is not a desirable situation since it may increase the recovery time of the amplifier stage AMPST.

Figure 15:
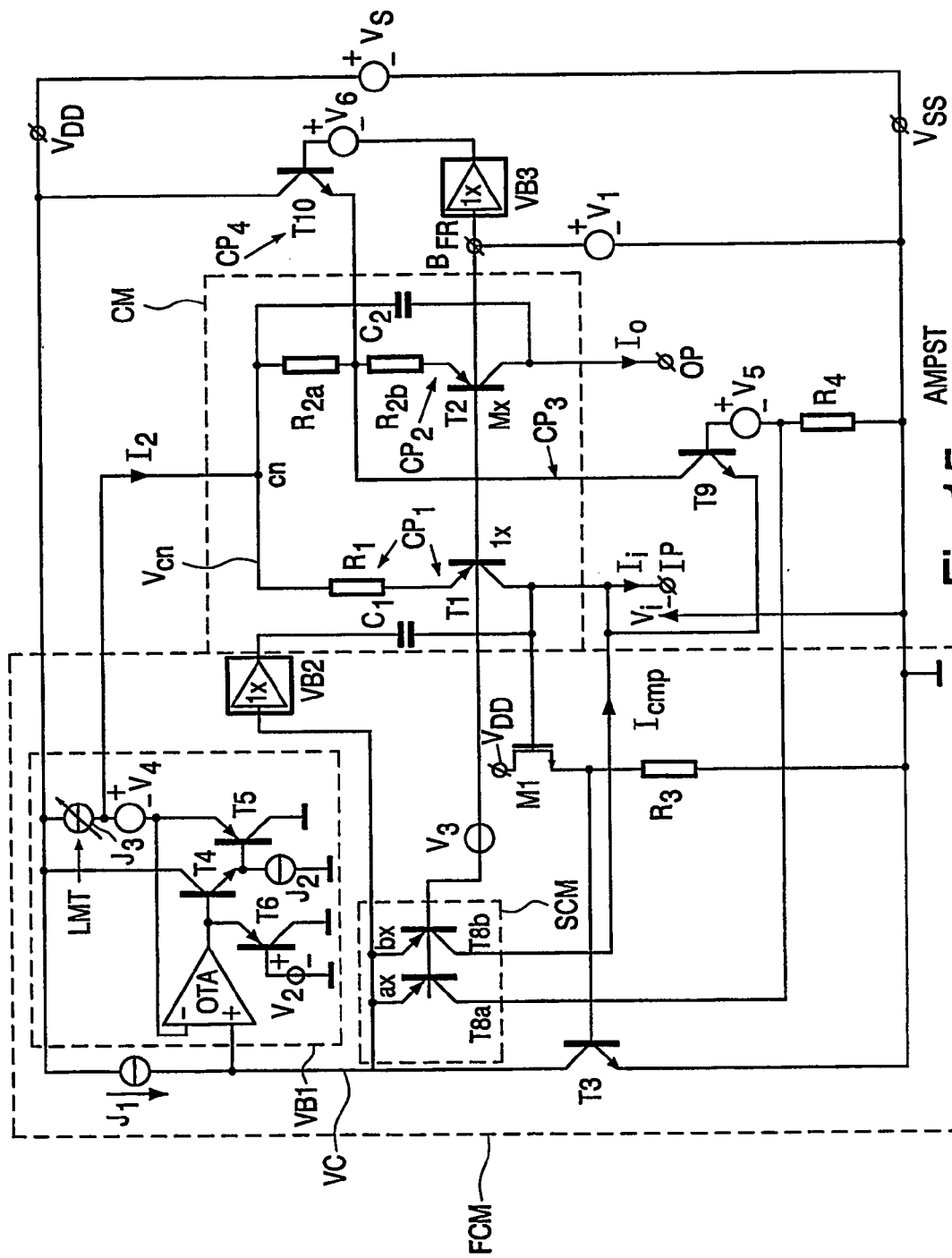

In view of the above, another measure for the implementation of the minimum fold-back mode is disclosed in the electronic circuit of FIG. 15.

FIG. 15 shows an electronic circuit comprising an amplifier stage AMPST which differs from the one shown in FIG. 14 in that it further comprises a transistor $T_{10}$ having a base, an emitter coupled to the second current path $CP_2$ (in this example the emitter is connected to the collector of the transistor $T_9$), and a collector connected to the first power supply terminal $V_{DD}$; a buffer VB3 having an input connected to the reference terminal $B_{RF}$, and an output; and a voltage source $V_6$ connected between the base of the transistor $T_{10}$ and the output of the buffer VB3.

The fourth current path $CP_4$, and thus the minimum fold-back mode, is implemented thereby. The voltage delivered by the voltage source $V_6$ is chosen to be such that, when the amplitude of the output current $I_0$ tends to become lower than the output reference level $Io_{mn}$, the transistor $T_{10}$ delivers a current (whose value increases with a further increase in value of the input current $I_i$) to the second current path $CP_2$. As a consequence the value of the output current $I_o$ remains approximately constant.

The manner in which the minimum fold-back mode is implemented in the circuit according to FIG. 14 at the same time also determines a minimum value $Io_{mn}$ of the output current $I_o$ in the normal mode. For some applications this is not a problem.

Figure 16:
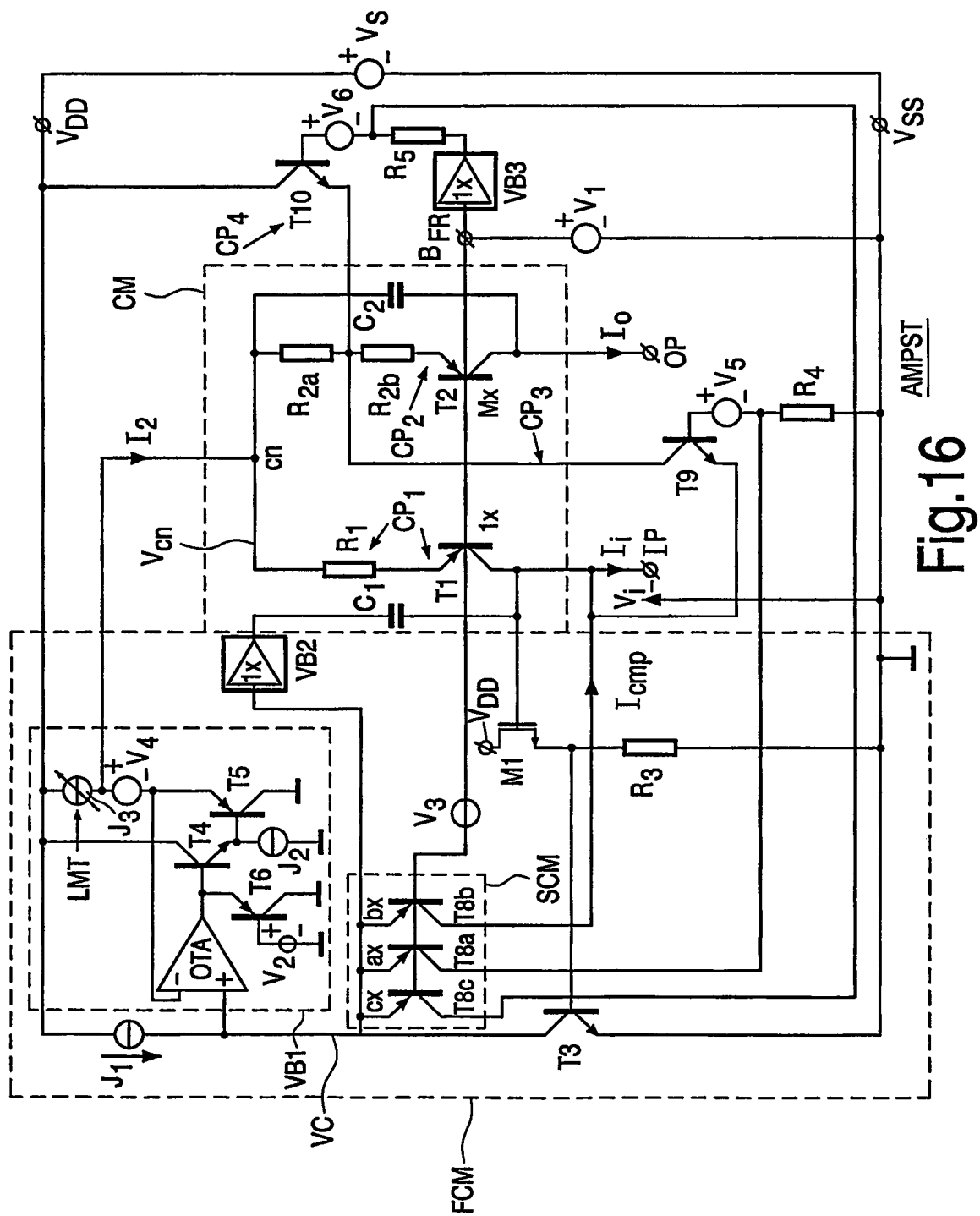

FIG. 16 shows an electronic circuit comprising an amplifier stage AMPST which differs from the one shown in FIG. 15 in that it further comprises a resistor $R_5$ connected between the output of the buffer VB3 and the voltage source $V_6$; and in that the second control means SCM further comprises a bipolar transistor $T_{8c}$ having a base connected to the base of the transistor $T_{8a}$, an emitter connected to the emitter of the transistor $T_{8a}$, and a collector connected to a common connection point of the voltage source $V_6$ and the resistor $R_5$. Optionally (not shown in FIG. 16), an additional voltage source may be arranged in series with the buffer VB3.

The transistor $T_{8c}$ delivers a current when the amplifier stage is not in the normal mode. A voltage across the resistor $R_5$ is created thereby. This increases the voltage at the base of transistor $T_{10}$. As a consequence the transistor $T_{10}$ conducts current during the minimum fold-back mode. When, however, the amplifier stage is in the normal mode, the transistor $T_{8c}$ does not deliver any current. As a consequence there is virtually no voltage across the resistor $R_5$, and thus the transistor $T_{10}$ does not conduct any current (provided the value of the voltage delivered by the voltage source $V_6$ is not chosen too large).

Thus the fourth current path $CP_4$ is inactive in the normal mode, and the value of the output current is not restricted to the minimum value $Io_{mn}$ in the normal mode.

It is to be emphasized that many variations may be applied to the implementations of the disclosed electronic circuits. For instance, P-type transistors may be replaced by N-type transistors and vice versa It may then be necessary to adapt the polarities of the voltages and currents delivered by the voltage sources and the current sources, respectively. Furthermore, other types of transistors may be suitable. Basically all the indicated types of transistors maybe replaced by other types of transistors. For instance, transistors $T_1$ and $T_2$ may be replaced (both) by field effect transistors. The transistor $M_1$ may be replaced by a bipolar transistor. The current mirror CM may also be implemented by more sophisticated current mirrors, for instance current mirrors which additionally use cascode transistors (for cascoding the transistors $T_1$ and $T_2$), or which are provided with feedback means for the purpose of reducing the input impedance and/or increasing the output impedance.

Furthermore, the electronic circuits may be implemented in an IC or may be fully/partly constructed with discrete components.

The electronic circuits may be applied in all kinds of apparatus and systems which need means to limit an output signal and which need a very short recovery time when the relatively strong input signal is reduced to a relatively weak input signal.

The invention claimed is:

1. An electronic circuit comprising an amplifier stage having an input for receiving an input signal and an output for supplying an output signal, wherein, during operation, the strength of the output signal increases in response to an increasing strength of the input signal as long as the strength of the input signal has not exceeded an input reference level, characterized in that the strength of the output signal is kept approximately constant when the strength of the input signal has exceeded the input reference level but has not exceeded a further input reference level, and that the strength of the output signal decreases in response to an increasing strength of the input signal when the strength of the input signal has exceeded the further input reference level, characterized in that the strength of the output signal cannot become lower than an output reference level when the strength of the input signal has exceeded the further input reference level.

2. The electronic circuit as claimed in claim 1, characterized in that the further input reference level is approximately equal to the input reference level.

3. The electronic circuit claimed in claim 1, characterized in that the input signal is an input current, and the output signal is an output current.

4. An electronic circuit comprising an amplifier stage having an input for receiving an input signal and an output for supplying an output signal, wherein, during operation, the strength of the output signal increases in response to an increasing strength of the input signal as long as the strength of the input signal has not exceeded an input reference level, characterized in that the strength of the output signal is kept approximately constant when the strength of the input signal has exceeded the input reference level but has not exceeded a further input reference level, and that the strength of the output signal decreases In response to an increasing strength of the input signal when the strength of the input signal has exceeded the further input reference level, wherein the input signal is an input current, and the output signal is an output current, characterized in that the amplifier stage comprises a first current path coupled between the input and a common node; a second current path coupled between the output and the common node first control means coupled between the input and the common node for controlling a voltage at the common node and for supplying a current to the common node, the first control means comprising limiting means for limiting the current to the common node when the strength of the input signal has exceeded the input reference level; and second control means for supplying a compensation current to the input when the strength of the input signal has exceeded the input reference level.

5. The electronic circuit claimed in claim 4, characterized in that the amplifier stage further comprises a third current path having a first side coupled to the input and a second side coupled to the second current path for taking away current from the second current path, such that the strength of the output current decreases in response to an increasing strength of the input signal when the strength of the input signal has exceeded the further input reference level.

6. The electronic circuit claimed in claim 5, characterized in that the amplifier stage further comprises a fourth current path coupled to the second current path for supplying current to the second current path in order to avoid that the output current can be lower than the output reference level when the strength of the input signal has exceeded the further input reference level.

7. An optical/magneto-optical disk recording apparatus comprising a light source for storing data on a disk, and light-receiving means for the detection of data from the disk, characterized in that the apparatus comprises an electronic circuit comprising an amplifier stage having an input for receiving an input signal and an output for supplying an output signal, wherein, during operation, the strength of the output signal increases in response to an increasing strength of the input signal as long as the strength of the input signal has not exceeded a level, characterized in that the strength of the output signal is kept approximately constant when the strength of the input signal has exceeded the input reference level but has not exceeded a further input reference level, and that the strength of the output signal decreases in response to an increasing strength of the input signal when the strength of the input signal has exceeded the further input reference level, wherein the input signal of the amplifier stage is responsive to a signal delivered by the light-receiving means.

8. A method whereby an input signal is converted into an output signal, and whereby the strength of the output signal increases in response to an increasing strength of the input signal as long as the strength of the input signal does not exceed an input reference level, and whereby the strength of the output signal is kept approximately constant when the strength of the input signal exceeds the input reference level but does not exceed a further input reference level, and whereby the strength of the output signal decreases in response to an increasing strength of the input signal when the strength of the input signal exceeds the further input reference level, characterized in that the strength of the output signal does not become lower than an output reference level when the strength of the input signal exceeds the further input reference level.

\* \* \* \* \*